(12) United States Patent
Watanabe et al.

(10) Patent No.: US 12,154,790 B2
(45) Date of Patent: Nov. 26, 2024

(54) ETCHING METHOD AND PLASMA PROCESSING APPARATUS

(71) Applicant: TOKYO ELECTRON LIMITED, Tokyo (JP)

(72) Inventors: Seiichi Watanabe, Miyagi (JP); Manabu Sato, Miyagi (JP); Masayuki Sawataishi, Miyagi (JP); Hiroki Yamada, Miyagi (JP); Shinji Orimo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 223 days.

(21) Appl. No.: 17/672,217

(22) Filed: Feb. 15, 2022

(65) Prior Publication Data

US 2022/0262601 A1 Aug. 18, 2022

(30) Foreign Application Priority Data

Feb. 16, 2021 (JP) ................................. 2021-022434

(51) Int. Cl.
*H01L 21/3065* (2006.01)
*H01J 37/32* (2006.01)
(Continued)

(52) U.S. Cl.
CPC .... *H01L 21/3065* (2013.01); *H01J 37/32091* (2013.01); *H01J 37/32174* (2013.01); *H01J 37/32449* (2013.01); *H01L 21/02164* (2013.01); *H01L 21/31116* (2013.01); *H01L 21/31144* (2013.01); *H01L 21/32136* (2013.01); *H01L 21/32137* (2013.01); *H01L 21/67069* (2013.01); *H01L 21/76816* (2013.01); *H01L 21/76829* (2013.01); *H01J 2237/334* (2013.01)

(58) Field of Classification Search
None
See application file for complete search history.

(56) References Cited

U.S. PATENT DOCUMENTS 8,609,546 B2 * 12/2013 Lee ................... H01L 21/32136
438/711
9,673,058 B1 6/2017 Briggs et al.
(Continued)

FOREIGN PATENT DOCUMENTS

JP 2014-090022 A 5/2014
JP 2021-013015 A 2/2021

*Primary Examiner* — Jiong-Ping Lu
(74) *Attorney, Agent, or Firm* — XSENSUS LLP (57) ABSTRACT

An etching method includes (a) disposing a substrate having a silicon oxide film on a substrate support in a chamber. The substrate includes a plurality of etching stop layers arranged inside the silicon oxide film. The plurality of etching stop layers are arranged at different positions in a thickness direction of the silicon oxide film. Each of the plurality of etching stop layers is formed of at least one of tungsten and molybdenum. The etching method (b) supplying a processing gas into the chamber, the processing gas including a gas containing at least one of tungsten and molybdenum, a gas containing carbon and fluoride, and an oxygen-containing gas; and (c) generating plasma from the processing gas to etch the silicon oxide film, thereby forming a plurality of recesses that reach the plurality of etching stop layers, respectively, in the silicon oxide film.

19 Claims, 5 Drawing Sheets

(51) Int. Cl.
*H01L 21/02* (2006.01)
*H01L 21/311* (2006.01)
*H01L 21/3213* (2006.01)
*H01L 21/67* (2006.01)
*H01L 21/768* (2006.01)

(56) References Cited

U.S. PATENT DOCUMENTS

2010/0273332 A1* 10/2010 Edelberg ............. H01J 37/3244
156/345.24
2014/0120732 A1* 5/2014 Matsumoto ....... H01L 21/31116
438/723
2020/0126804 A1* 4/2020 Dole ................ H01L 21/32133

* cited by examiner

ETCHING METHOD AND PLASMA PROCESSING APPARATUS

CROSS-REFERENCE TO RELATED APPLICATIONS

This application is based on and claims priority from Japanese Patent Application No. 2021-022434, filed on Feb. 16, 2021, with the Japan Patent Office, the disclosure of which is incorporated herein in its entirety by reference.

TECHNICAL FIELD

The present disclosure relates to an etching method and a plasma processing apparatus.

BACKGROUND

Japanese Patent Laid-Open Publication No. 2014-090022 discloses a plasma processing method which forms a plurality of holes having different depths in a multilayer film. The multilayer film includes an oxide layer, and a plurality of etching stop layers formed of tungsten and arranged at different positions in the stacking direction below the upper surface of the oxide layer in the stacking direction. A plurality of holes is formed by generating plasma from a processing gas, and etching the oxide layer from the upper surface of the oxide layer until reaching the plurality of etching stop layers. The processing gas includes a fluorocarbon-based gas, a noble gas, and nitrogen.

SUMMARY

According to an embodiment, an etching method includes: (a) disposing a substrate having a silicon oxide film on a substrate support in a chamber, the substrate including a plurality of etching stop layers arranged inside the silicon oxide film, and the plurality of etching stop layers being arranged at different positions in a thickness direction of the silicon oxide film and each formed of at least one of tungsten and molybdenum; (b) supplying a processing gas into the chamber, the processing gas including a gas containing at least one of tungsten and molybdenum, a gas containing carbon and fluoride, and an oxygen-containing gas; and (c) generating plasma from the processing gas to etch the silicon oxide film, thereby forming a plurality of recesses that reach the plurality of etching stop layers, respectively, in the silicon oxide film.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described.

According to an embodiment, an etching method includes: (a) disposing a substrate having a silicon oxide film on a substrate support in a chamber, the substrate including a plurality of etching stop layers arranged inside the silicon oxide film, and the plurality of etching stop layers being arranged at different positions in a thickness direction of the silicon oxide film and each formed of at least one of tungsten and molybdenum; (b) supplying a processing gas into the chamber, the processing gas including a gas containing at least one of tungsten and molybdenum, a gas containing carbon and fluoride, and an oxygen-containing gas; and (c) generating plasma from the processing gas to etch the silicon oxide film, thereby forming a plurality of recesses that reach the plurality of etching stop layers, respectively, in the silicon oxide film.

According to the etching method above, in (c), when the recesses reach the etching stop layers, respectively, a substance generated from the gas containing at least one of tungsten and molybdenum in the plasma is deposited on the bottoms of the recesses. As a result, the etching rate of the etching stop layers decreases, so that the etching selectivity of the silicon oxide film with respect to the etching stop layers may be improved.

In an embodiment, the gas containing at least one of tungsten and molybdenum may include at least one of tungsten hexafluoride gas and molybdenum hexafluoride gas.

In an embodiment, in (c), the pressure in the chamber may be set to 2.0 Pa or more and 3.3 Pa or less.

In an embodiment, the ratio of the flow rate of the gas containing at least one of tungsten and molybdenum in the processing gas to the flow rate of the processing gas may be 5% by volume or less.

In an embodiment, in (c), the temperature of the substrate support may be set to 0° C. or higher and 120° C. or lower.

In an embodiment, the processing gas may include fluorocarbon gas as the gas containing carbon and fluorine.

In an embodiment, (c) may include periodically applying a negative pulse voltage to the substrate support.

In an embodiment, in (c), the absolute value of the pulse voltage applied to the substrate support may be 150 V or more and 1,000 V or less.

In an embodiment, in (c), the pulse voltage periodically applied to the substrate support may have a duty ratio of 50% or more and 100% or less.

In an embodiment, in (c), the frequency that defines a cycle in which the pulse voltage is applied to the substrate support may be 100 kHz or more and 1 MHz or less.

According to another embodiment, a plasma processing apparatus includes: a chamber; a substrate support configured to support a substrate in the chamber; a gas supply configured to supply a processing gas into the chamber; a plasma generator configured to generate plasma from the processing gas in the chamber; and a controller configured to control an overall operation of the plasma processing apparatus. The controller is configured to execute a process including: (a) disposing the substrate on the substrate support in the chamber, the substrate having a silicon oxide film and including a plurality of etching stop layers arranged inside the silicon oxide film, and the plurality of etching stop layers being arranged at different positions in a thickness direction of the silicon oxide film and each formed of at least one of tungsten and molybdenum; (b) supplying a processing gas into the chamber, the processing gas including a gas containing at least one of tungsten and molybdenum, a gas containing carbon and fluoride, and an oxygen-containing gas; and (c) generating plasma from the processing gas to etch the silicon oxide film, thereby forming a plurality of recesses that reach the plurality of etching stop layers, respectively, in the silicon oxide film.

Hereinafter, the various embodiments will be described in detail with reference to the drawings. In the respective drawings, similar or corresponding portions will be denoted by the same reference numerals.

Figure 1:
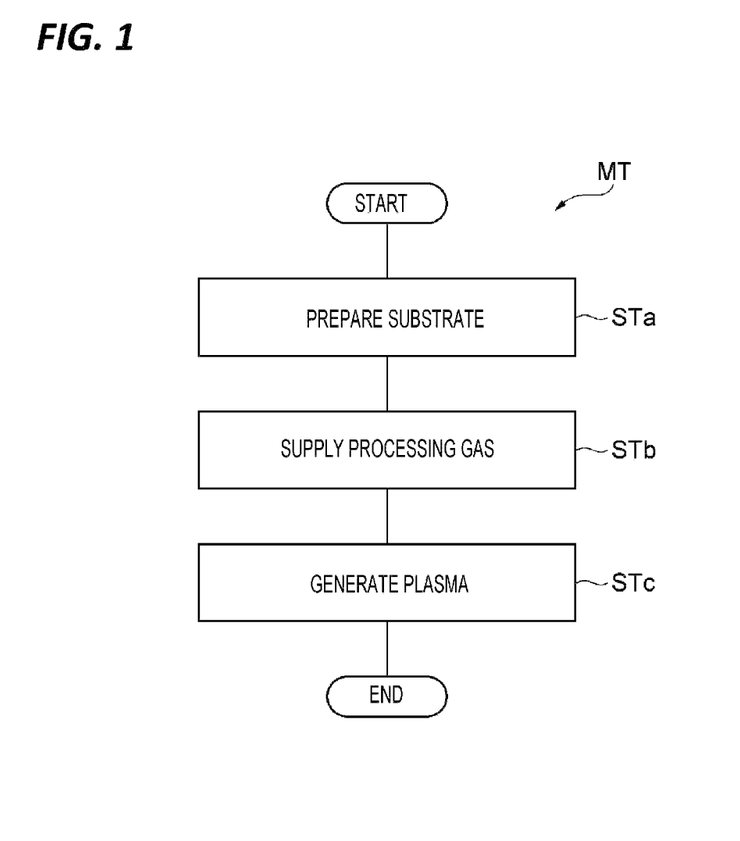
FIG. 1 is a flowchart of an etching method according to an embodiment.

FIG. 1 is a flowchart of an etching method according to an embodiment. The etching method illustrated in FIG. 1 (hereinafter, referred to as a "method MT") is performed to etch a silicon oxide film of a substrate, thereby forming a recess in the silicon oxide film.

Figure 2:
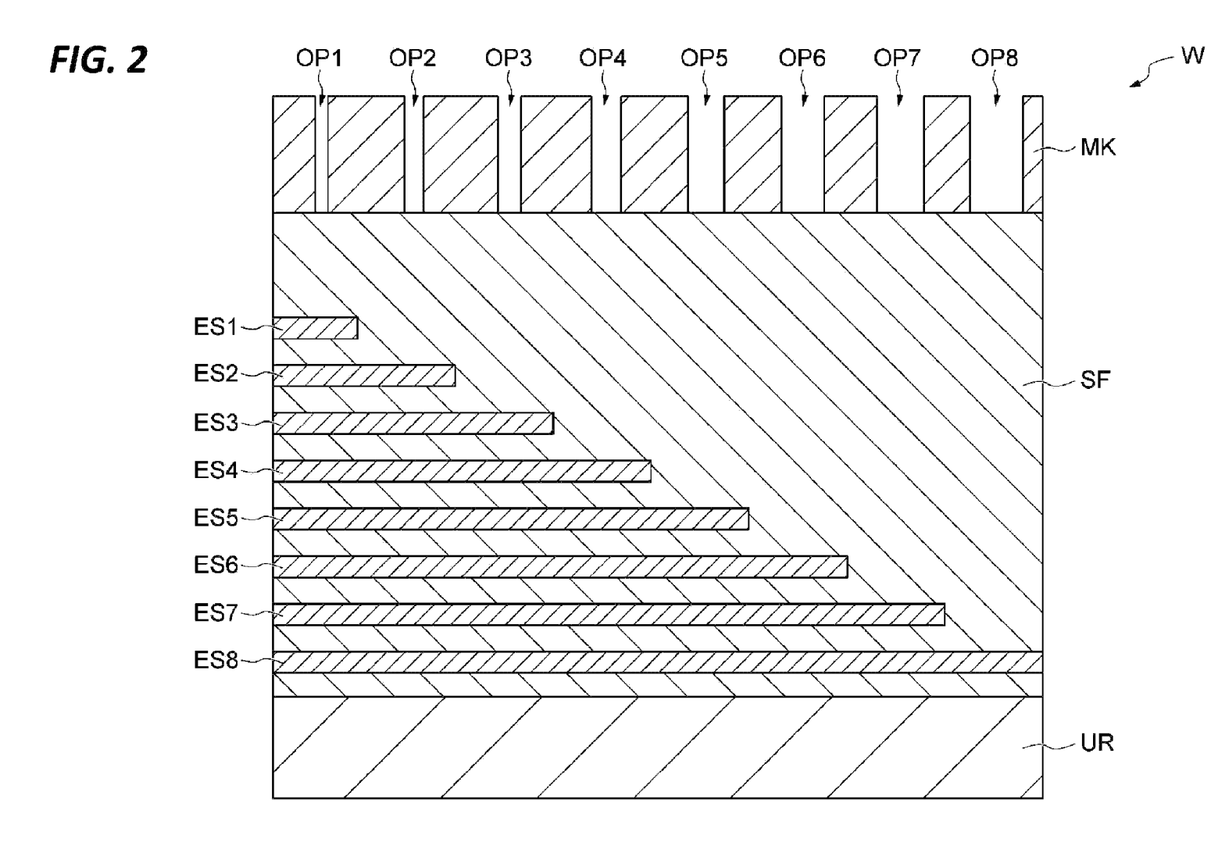
FIG. 2 is a partially enlarged cross-sectional view of an example of a substrate.

FIG. 2 is a partially enlarged cross-sectional view of an example of a substrate. The method MT may be applied to a substrate W illustrated in FIG. 2. The substrate W is, for example, a substrate for forming a three-dimensional NAND device. As illustrated in FIG. 2, the substrate W has a silicon oxide film SF. The substrate W may further have a mask MK and a base region UR. The silicon oxide film SF is formed on the base region UR. The mask MK is formed on the silicon oxide film SF. The mask MK is formed of an organic material such as polycrystalline silicon or amorphous carbon. The mask MK has a pattern that is transferred to the silicon oxide film SF through an etching. The mask MK has a plurality of openings OP1 to OP8. Each of the openings OP1 to OP8 has, for example, a hole pattern. In the example of FIG. 2, the diameters of the openings OP1 to OP8 are different from each other. However, the diameters of the openings OP1 to OP8 may be the same. Further, the openings OP1 to OP8 may be set to be wider according to the depths thereof, or may be set to have the same aspect ratio determined by the ratio of a depth dimension of each opening with respect to an opening dimension.

The silicon oxide film SF is formed of at least one material containing silicon and oxygen. The silicon oxide film SF may be formed of a single-layer film of a silicon oxide film. The substrate W includes a plurality of etching stop layers ES1 to ES8 arranged inside the silicon oxide film SF. The positions of the plurality of etching stop layers ES1 to ES8 in the thickness direction of the silicon oxide film SF are different from each other, and become deeper in an order of the etching stop layers ES1 to ES8. The etching stop layer ES1 is closest to the mask MK. The silicon oxide film SF is disposed between the etching stop layer ES1 and the mask MK. The etching stop layer ES8 is closest to the base region UR. The silicon oxide film SF is disposed between the etching stop layer ES8 and the base region UR. The silicon oxide film SF is disposed between etching stop layers adjacent to each other in the thickness direction of the silicon oxide film SF (e.g., the etching stop layers ES1 and ES2). The plurality of etching stop layers ES1 to ES8 have end portions disposed between the plurality of respectively corresponding openings OP1 to OP8 of the mask MK and the base region UR. Each of the plurality of etching stop layers ES1 to ES8 contains at least one of tungsten and molybdenum. Each of the plurality of etching stop layers ES1 to ES8 may be a tungsten layer or a molybdenum layer.

As illustrated in FIG. 1, the method MT starts from step STa. Steps STa, STb, and STc are performed in this order. When step STc is completed, the method MT ends. Steps STb and STc may be performed at the same time.

During step STa, the substrate W is prepared in a chamber of the plasma processing apparatus. The substrate W is placed on a substrate support in the chamber.

During step STb, a processing gas is supplied into the chamber of the plasma processing apparatus. The processing gas includes a gas containing at least one of tungsten and molybdenum (hereinafter, referred to as a "W/Mo-containing gas"), a gas containing carbon and fluoride, and an oxygen-containing gas. The processing gas may further include an inert gas such as a noble gas.

The W/Mo-containing gas may include at least one of tungsten hexafluoride gas ($WF_6$ gas) and molybdenum hexafluoride gas ($MoF_6$ gas). The W/Mo-containing gas may contain the same metal as the metal included in the etching stop layers ES1 to ES8. For example, when the etching stop layers ES1 to ES8 include tungsten, the W/Mo-containing gas may contain tungsten. When the etching stop layers ES1 to ES8 include molybdenum, the W/Mo-containing gas may contain molybdenum. The ratio of the flow rate of the W/Mo-containing gas to the flow rate of the processing gas supplied into the chamber may be 5% by volume or less, 0.5% by volume or more, and 2.0% by volume or less. The gas containing carbon and fluorine may include fluorocarbon gas. The fluorocarbon gas may include one or more of $C_4F_6$ gas, $C_4F_8$ gas, $C_3F_8$ gas, and $CF_4$ gas. The oxygen-containing gas may include one or more of $O_2$ gas, CO gas, and $CO_2$ gas.

Figure 3:
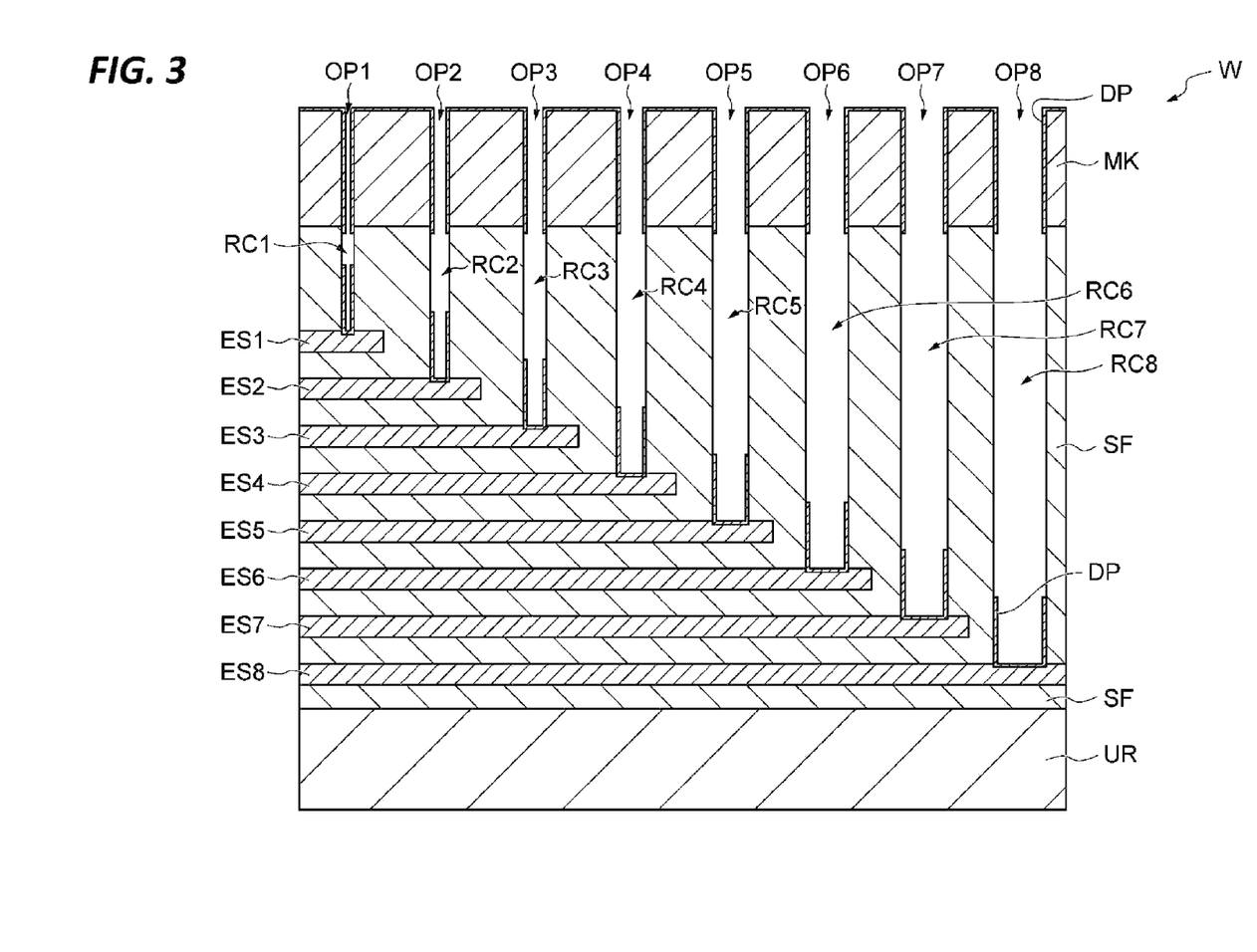
FIG. 3 is a partially enlarged cross-sectional view of an example of an etched substrate.

During step STc, plasma is generated from the processing gas to etch the silicon oxide film SF. As a result, as illustrated in FIG. 3, a plurality of recesses RC1 to RC8 is formed in the silicon oxide film SF to reach the plurality of etching stop layers ES1 to ES8, respectively. FIG. 3 is a partially enlarged cross-sectional view of the substrate W of FIG. 2 after the etching. Each of the recesses RC1 to RC8 is, for example, a contact hole. Each of the recesses RC1 to RC8 has, for example, a circular shape in the cross section orthogonal to the thickness direction of the silicon oxide film SF. The diameters of the recesses RC1 to RC8 are different from each other, and become larger in an order of the recesses RC1 to RC8. The diameters of the recesses RC1 to RC8 are the same as the diameters of the openings OP1 to OP8 of the mask MK, respectively. The recesses RC1 to RC8 have substantially the same aspect ratio that indicates the ratio of a depth from the surface of the silicon oxide film to each of the etching stop layers with respect to the opening dimension of each of the recesses RC1 to RC8.

Step STc is performed during the supply of the processing gas into the chamber in step STb. During the time period when step STc is performed, the pressure in the chamber may be set to 2.0 Pa or more and 3.3 Pa or less (15 mTor or more and 25 mTor or less). During the time period when step STc is performed, the temperature of the substrate support may be set to 0° C. or higher and 120° C. or lower. When the temperature of the substrate support during step STc is lower than 0° C., the adhesion coefficient of deposits to the mask MK is high, and thus, a clogging may occur due to the deposits on the mask MK which causes an etching defect. When the temperature of the substrate support during step STc is higher than 120° C., the adhesion coefficient of deposits to the mask MK is low, and thus, the amount of the deposits in the recesses RC1 to RC8 excessively increases, which causes an etching defect.

The etching of the silicon oxide film SF in step STc may be stopped at the plurality of etching stop layers ES1 to ES8. In step STc, when the recesses RC1 to RC8 reach the etching stop layers ES1 to ES8, respectively, a substance generated from the W/Mo-containing gas in the plasma is deposited on the bottoms of the recesses RC1 to RC8. It is presumed that a deposit film DP is formed as a result. The substance generated from the W/Mo-containing gas in the plasma is, for example, a radical containing tungsten or a radical containing molybdenum. It is presumed that the deposit film DP is also formed on the side walls of the recesses RC1 to RC8 near the bottoms of the recesses RC1 to RC8. It is presumed that the deposit film DP is also formed on the upper surface of the mask MK and the side walls of the openings OP1 to OP8.

According to the method MT, the etching of the etching stop layers ES1 to ES8 is suppressed. It is presumed that this is because the deposit film DP is formed on the bottoms of the recesses RC1 to RC8. As a result, the etching rate of the etching stop layers ES1 to ES8 decreases, so that the etching selectivity of the silicon oxide film SF with respect to the etching stop layers ES1 to ES8 may be improved. In an example, when $WF_6$ gas is used, the etching selectivity of the silicon oxide film with respect to the etching stop layers increases by 65%, as compared with a case where $WF_6$ gas is not used. Further, the etching of the mask MK is suppressed. It is presumed that this is because the deposit film DP is formed on the surface of the mask MK. As a result, the etching rate of the mask MK decreases, so that the etching selectivity of the silicon oxide film SF with respect to the mask MK may be improved. In an example, when $WF_6$ gas is used, the etching selectivity of the silicon oxide film with respect to the mask increases by 70%, as compared with a case where $WF_6$ gas is not used. Thus, the etching rate of the etching of the silicon oxide film SF may be increased, while keeping the small amount of the decrease of the mask MK and the etching stop layers ES1 to ES8 caused from the etching. When the W/Mo-containing gas includes fluorine, fluorine radicals generated in plasma promote the etching of the silicon oxide film SF. Thus, the etching rate of the silicon oxide film SF may be increased. In an example, when $WF_6$ gas is used, the etching rate of the silicon oxide film increases by 8.8%, as compared with a case where $WF_6$ gas is not used. Further, when the W/Mo-containing gas is used, the shape distortion of the bottoms of the recesses RC1 to RC8 may be reduced. In an example, when $WF_6$ gas is used, an index indicating a small distortion increases by 87%, as compared with a case where $WF_6$ gas is not used. The index indicating a small distortion is a value obtained by dividing the minimum diameter of the bottom of a recess having a circular shape by the maximum diameter thereof.

When the W/Mo-containing gas contains the same metal as the metal included in the etching stop layers ES1 to ES8, the variation of the resistance values of the etching stop layers ES1 to ES8 due to the metal (e.g., the deposit film DP) is reduced. Accordingly, when a conductor filled in the recesses RC1 to RC8 includes the same metal as the metal included in the etching stop layers ES1 to ES8, the resistance value between the conductor and the etching stop layers ES1 to ES8 may be reduced. Further, the etching damage of the etching stop layers ES1 to ES8 is repaired by the metal (e.g., the deposit film DP).

Figure 4:
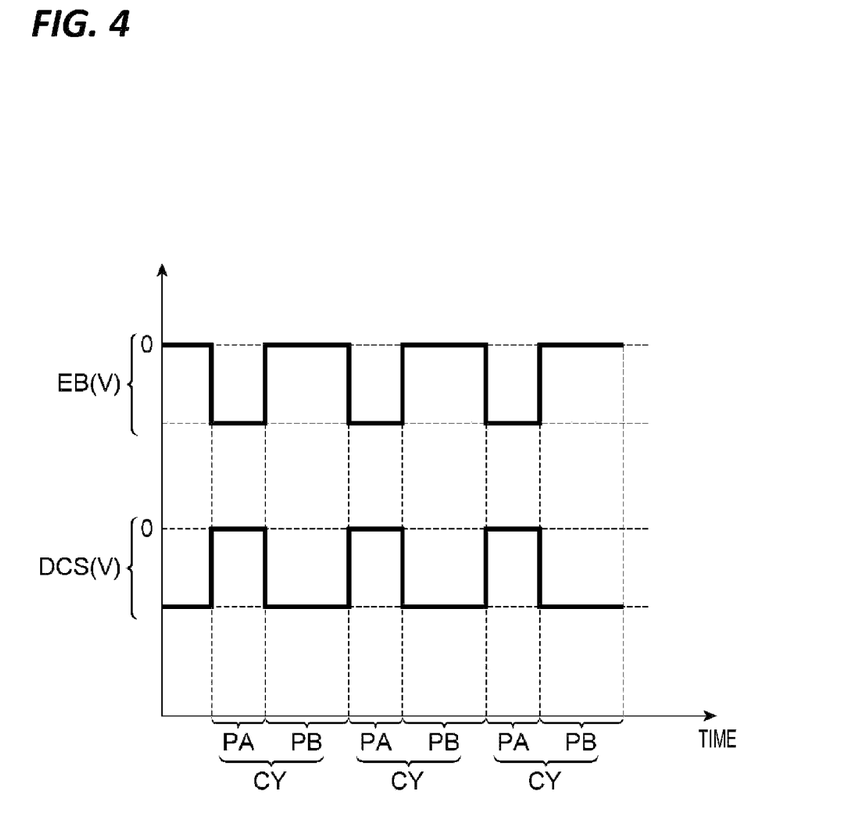
FIG. 4 is an example of a timing chart illustrating temporal changes of an electric bias applied to a lower electrode and an electric bias applied to an upper electrode.

FIG. 4 is an example of a timing chart illustrating temporal changes of an electric bias applied to the lower electrode and an electric bias applied to the upper electrode.

The timing chart relates to step STc of the method MT. Step STc may include periodically generating a negative electric potential in the substrate W when an electric bias EB (a negative pulse voltage) is applied to the substrate support supporting the substrate W. In an example, as illustrated in FIG. 4, a negative DC voltage is periodically applied to the lower electrode of the substrate support as the electric bias EB according to a cycle CY. The cycle CY includes periods PA and PB. The negative DC voltage is applied to the lower electrode of the substrate support during the period PA. During the period PB, the application of the negative DC voltage to the lower electrode of the substrate support is stopped. The absolute value of the negative DC voltage applied to the lower electrode of the substrate support during the period PA may be 150 V or more and 1,000 V or less. The occupying ratio of the period PA in the cycle CY, that is, the duty ratio of the negative DC voltage periodically applied to the lower electrode in step STc may be 50% or more and 100% or less. The duty ratio may be 60% or more and 80% or less. The frequency that defines the cycle CY may be 100 kHz or more and 1 MHz or less. The frequency that defines the cycle CY may be 300 kHz or more and 800 kHz or less. The time length of the cycle CY is a reciprocal of the frequency that defines the cycle CY. The electric bias EB represents a rectangular wave in FIG. 4, but may represent a triangular wave or an impulse.

In an embodiment, the plasma processing apparatus used in the method MT may be a capacitively coupled plasma processing apparatus. That is, the plasma processing apparatus may further include an upper electrode. The upper electrode is provided above the substrate support. In step STc, another electric bias DCS may be applied to the upper electrode. Specifically, as illustrated in FIG. 4, in step STc, the negative DC voltage is applied to the upper electrode as the electric bias DCS during the period PB within the cycle CY. During the period PA, the application of the negative DC voltage to the upper electrode may be stopped. Alternatively, the absolute value of the negative DC voltage applied to the upper electrode during the period PA may be smaller than the absolute value of the negative DC voltage applied to the upper electrode during the period PB.

Figure 5:
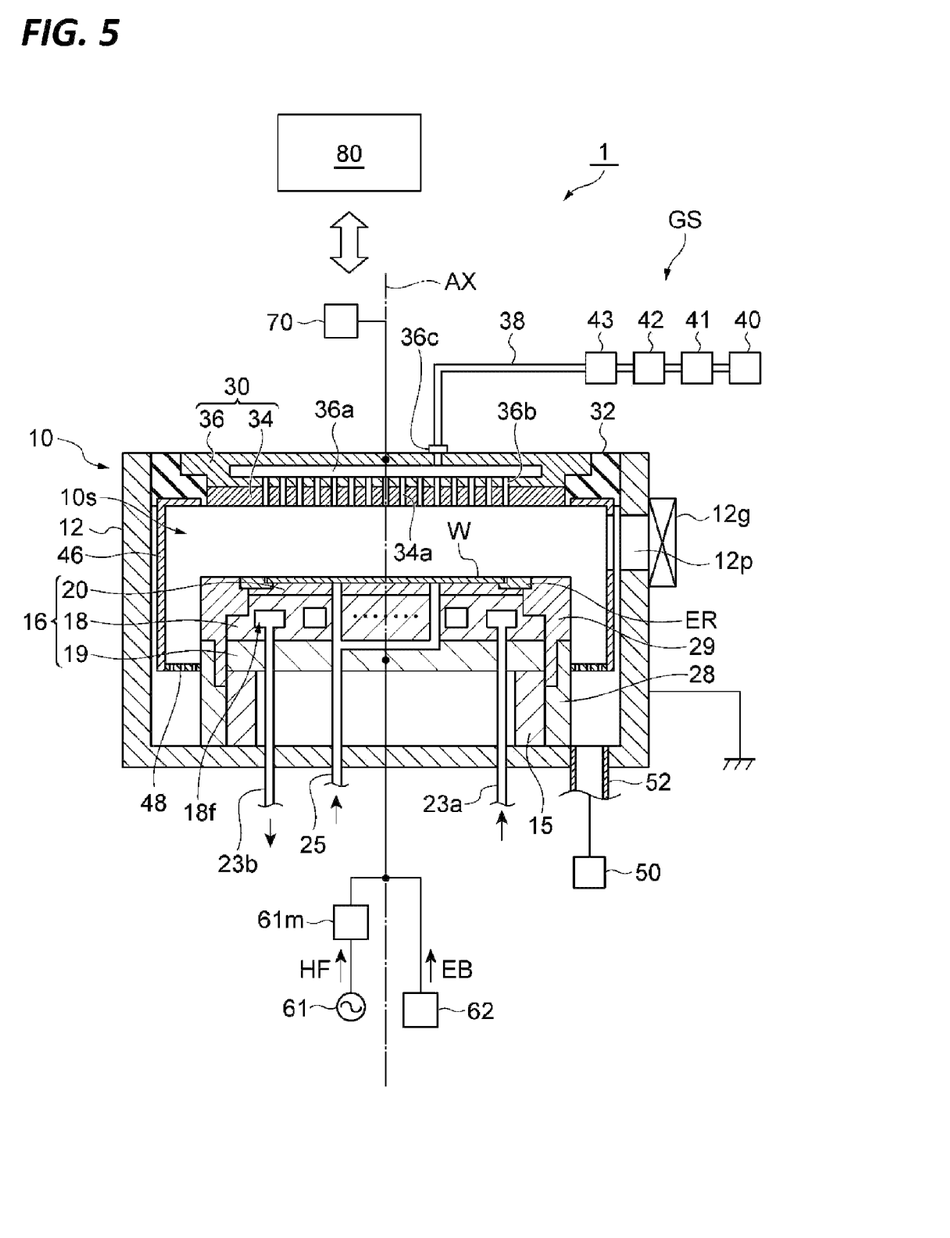
FIG. 5 is a view schematically illustrating a plasma processing apparatus according to an embodiment.

Hereinafter, the plasma processing apparatus that may be used for executing the method MT will be described. FIG. 5 is a view schematically illustrating a plasma processing apparatus according to an embodiment. A plasma processing apparatus 1 illustrated in FIG. 5 may be used for the method MT. The plasma processing apparatus 1 is a capacitively coupled plasma processing apparatus.

The plasma processing apparatus 1 includes a chamber 10. The chamber 10 provides an internal space 10s therein. The central axis of the chamber 10 is a vertically extending axis AX. In an embodiment, the chamber 10 includes a chamber body 12. The chamber body 12 has a substantially cylindrical shape. The internal space 10s is provided inside the chamber body 12. The chamber body 12 is formed of, for example, aluminum. The chamber body 12 is electrically grounded. A corrosion-resistant film is formed on the inner wall surface of the chamber body 12. The corrosion-resistant film may be formed of ceramic such as aluminum oxide or yttrium oxide.

The chamber body 12 provides a passage 12p in the side wall thereof. The substrate W passes through the passage 12p when being transferred between the internal space 10s and the outside of the chamber 10. The passage 12p is openable/closable by a gate valve 12g. The gate valve 12g is provided along the side wall of the chamber body 12.

The plasma processing apparatus 1 further includes a substrate support 16. The substrate support 16 is configured to support the substrate W inside the chamber 10. The substrate W may have a substantially disc shape. The substrate support 16 may be supported by a support 15. The support 15 extends upward from the bottom of the chamber body 12. The support 15 has a substantially cylindrical shape. The support 15 is formed of an insulating material such as quartz.

The substrate support 16 includes a lower electrode 18. The substrate support 16 may further include an electrostatic chuck 20. The substrate support 16 may further include an electrode plate 19. The electrode plate 19 is formed of a conductive material such as aluminum. The electrode plate 19 has a substantially disc shape, and a central axis thereof is the axis AX. The lower electrode 18 is provided on the electrode plate 19. The lower electrode 18 is formed of a conductive material such as aluminum. The lower electrode 18 has a substantially disc shape, and a central axis thereof is the axis AX. The lower electrode 18 is electrically connected to the electrode plate 19.

The lower electrode 18 provides a flow path 18f therein. The flow path 18f is a flow path for a heat exchange medium (e.g., a coolant). The flow path 18f receives the heat exchange medium from a supply device (e.g., a chiller unit) through a pipe 23a. The supply device is provided outside the chamber 10. The heat exchange medium supplied to the flow path 18f flows through the flow path 18f, and is returned to the supply device through a pipe 23b. The supply device that supplies the heat exchange medium makes up a temperature adjustment mechanism of the plasma processing apparatus 1.

The electrostatic chuck 20 is provided on the lower electrode 18. The substrate W is placed on the upper surface of the electrostatic chuck 20. The electrostatic chuck 20 has a main body and an electrode (chuck electrode). The main body of the electrostatic chuck 20 is formed of a dielectric material. Each of the electrostatic chuck 20 and the main body thereof has a substantially disc shape, and a central axis thereof is the axis AX. The chuck electrode of the electrostatic chuck 20 is a film-shaped electrode, and is provided in the main body of the electrostatic chuck 20. The chuck electrode of the electrostatic chuck 20 is connected to a DC power supply via a switch. When a voltage from the DC power supply is applied to the electrode of the electrostatic chuck 20, an electrostatic force is generated between the electrostatic chuck 20 and the substrate W. The substrate W is attracted to the electrostatic chuck 20 and held by the electrostatic chuck 20, due to the generated electrostatic force. As described later, when a bias electrode is provided in the electrostatic chuck 20, the chuck electrode may be provided on the front surface of the electrostatic chuck 20 (the surface on which the substrate W is to be placed), and the bias electrode may be provided on the back surface of the electrostatic chuck 20 (the surface facing the lower electrode 18).

The substrate support 16 may further support an edge ring ER disposed thereon. The edge ring ER may be formed of silicon, silicon carbide, or quartz. The substrate W is placed in the region surrounded by the edge ring ER on the electrostatic chuck 20.

The plasma processing apparatus 1 may further include a gas supply line 25. The gas supply line 25 supplies a heat transfer gas (e.g., He gas) from a gas supply mechanism to the space between the upper surface of the electrostatic chuck 20 and the back surface (lower surface) of the substrate W.

The plasma processing apparatus 1 may further include a cylindrical portion 28 and an insulating portion 29. The cylindrical portion 28 extends upward from the bottom of the chamber body 12. The cylindrical portion 28 extends along the outer periphery of the support 15. The cylindrical portion 28 is formed of a conductive material, and has a substantially cylindrical shape. The cylindrical portion 28 is electrically grounded. The insulating portion 29 is provided on the cylindrical portion 28. The insulating portion 29 is formed of a material having an insulating property. The insulating portion 29 is formed of, for example, a ceramic such as quartz. The insulating portion 29 has a substantially cylindrical shape. The insulating portion 29 extends along the outer periphery of the electrode plate 19, the outer periphery of the lower electrode 18, and the outer periphery of the electrostatic chuck 20.

The plasma processing apparatus 1 further includes an upper electrode 30. The upper electrode 30 is provided above the substrate support 16. The upper electrode 30 is supported in the upper portion of the chamber body 12 via a member 32. The member 32 is formed of a material having an insulating property. The upper electrode 30 and the member 32 close the upper opening of the chamber body 12.

The upper electrode 30 may include a top plate 34 and a support 36. The lower surface of the top plate 34 is the lower surface facing the internal space 10s, and defines the internal space 10s. The top plate 34 may be formed of a low-resistance conductor or semiconductor that generates less Joule heat. In an embodiment, the top plate 34 is formed of silicon. The top plate 34 provides a plurality of gas holes 34a. The plurality of gas holes 34a penetrate the top plate 34 in the thickness direction of the plate.

The support 36 detachably supports the top plate 34. The support 36 may be formed of a conductive material such as aluminum. The support 36 provides a gas diffusion chamber 36a therein. The support 36 further provides a plurality of gas holes 36b. The plurality of gas holes 36b extend downward from the gas diffusion chamber 36a. The plurality of gas holes 36b communicate with the plurality of gas holes 34a, respectively. The support 36 further provides a gas inlet port 36c. The gas inlet port 36c is connected to the gas diffusion chamber 36a. A gas supply pipe 38 is connected to the gas inlet port 36c.

A gas source group 40 is connected to the gas supply pipe 38 via a valve group 41, a flow rate controller group 42, and a valve group 43. The gas source group 40, the valve group 41, the flow rate controller group 42, and the valve group 43 make up a gas supply GS. The gas source group 40 includes a plurality of gas sources. The plurality of gas sources in the gas source group 40 include a plurality of gas sources used in the method MT. Each of the valve group 41 and the valve group 43 includes a plurality of opening/closing valves. The flow rate controller group 42 includes a plurality of flow rate controllers. Each of the plurality of flow rate controllers in the flow rate controller group 42 is a mass flow controller or a pressure control type flow controller. Each of the plurality of gas sources in the gas source group 40 is connected to the gas supply pipe 38 via a corresponding opening/closing valve of the valve group 41, a corresponding flow rate controller of the flow rate controller group 42, and a corresponding opening/closing valve of the valve group 43.

The plasma processing apparatus 1 may further include a shield 46. The shield 46 is detachably provided along the inner wall surface of the chamber body 12. The shield 46 suppresses byproducts of the plasma processing from being attached to the chamber body 12. The shield 46 is configured by forming a corrosion-resistant film on the surface of a member formed of, for example, aluminum. The corrosion-resistant film may be formed of ceramic such as yttrium oxide.

The plasma processing apparatus 1 may further include a baffle member 48. The baffle member 48 is provided between the member surrounding the substrate support 16 (e.g., the cylindrical portion 28) and the shield 46. The baffle member 48 is configured by forming a corrosion-resistant film on the surface of a member made of, for example, aluminum. The corrosion-resistant film may be formed of ceramic such as yttrium oxide. The baffle member 48 provides a plurality of through holes. An exhaust port 12 is provided in the bottom of the chamber body 12 below the baffle member 48. An exhaust device 50 is connected to the exhaust port via an exhaust pipe 52. The exhaust device 50 includes a pressure regulation valve and a vacuum pump such as a turbo molecular pump.

The plasma processing apparatus 1 further includes a radio-frequency power supply 61 and a pulse power supply 62. The radio-frequency power supply 61 is configured to generate a radio-frequency power (hereinafter, referred to as a "radio-frequency power HF"). The radio-frequency power HF has a frequency suitable for generating plasma. The frequency of the radio-frequency power HF is, for example, 27 MHz or more and 100 MHz or less. The radio-frequency power supply 61 is connected to the lower electrode 18 via a matching device 61m. The matching device 61m includes a circuit for matching the impedance of the load side of the radio-frequency power supply 61 (the lower electrode 18) with the output impedance of the radio-frequency power supply 61. In an embodiment, the radio-frequency power supply 61 makes up a plasma generator. The radio-frequency power supply 61 may be connected to the upper electrode 30 via the matching device 61m.

The pulse power supply 62 is configured to apply the above-described electric bias EB to the lower electrode 18. That is, the pulse power supply 62 is configured to generate a negative electric potential on the substrate W as the electric bias EB in step STc of the method MT. The pulse power supply 62 itself may be configured to periodically apply the electric bias EB to the lower electrode 18, or the pulse power supply 62 may be provided with a device for pulsing the electric bias EB on the downstream side of the pulse power supply 62. As described above, the electrical bias EB from the pulse power supply 62 is applied to the lower electrode 18 during the period PA within the cycle CY. During the period PB within the cycle CY, the application of the electric bias EB from the pulse power supply 62 to the lower electrode 18 is stopped. The pulse power supply 62 may be configured to apply the electric bias EB to the bias electrode provided in the electrostatic chuck 20, instead of the lower electrode 18.

In an embodiment, the plasma processing apparatus 1 may further include a DC power supply 70. The DC power supply 70 is configured to apply the above-described electric bias DCS to the upper electrode 30. That is, the DC power supply 70 is configured to periodically apply the negative DC voltage to the upper electrode 30 as the electric bias DCS. As described above, the negative DC voltage from the DC power supply 70 is applied to the upper electrode 30 during the period PB within the cycle CY. During the period PA within the cycle CY, the application of the negative DC voltage from the DC power supply 70 to the upper electrode 30 may be stopped. Alternatively, the absolute value of the negative DC voltage applied to the upper electrode in the period PA may be smaller than the absolute value of the negative DC voltage applied to the upper electrode in the period PB.

The plasma processing apparatus 1 may further include a controller 80. The controller 80 is a computer that includes, for example, a processor, a storage device, an input device, and a display device, and controls each unit of the plasma processing apparatus 1. Specifically, the controller 80 executes control programs stored in the storage device, and controls each unit of the plasma processing apparatus 1 based on recipe data stored in the storage device. A process designated by the recipe data is executed in the plasma processing apparatus 1 under the control of the controller 80. The method MT may be executed in the plasma processing apparatus 1 under the control of each unit of the plasma processing apparatus 1 by the controller 80.

When the method MT is applied to the substrate W using the plasma processing apparatus 1, the substrate W is placed on the substrate support 16 in step STa. In subsequent step STb, the controller 80 controls the gas supply GS to supply the above-described processing gas into the chamber 10. In subsequent step STc, the controller 80 controls the exhaust device 50 to set the pressure in the chamber 10 to a specified pressure. Further, in step STc, the controller 80 controls the plasma generator to generate plasma from the processing gas in the chamber 10. Specifically, the controller 80 controls the radio-frequency power supply 61 to supply the radio-frequency power HF. Further, in step STc, the controller 80 may control the pulse power supply 62 to periodically apply the negative DC voltage to the lower electrode 18 as the electric bias EB. In step STc, the controller 80 may control the DC power supply 70 to periodically apply the negative DC voltage to the upper electrode 30 as the above-described electric bias DCS.

While various embodiments have been described, various additions, omissions, substitutions, and changes may be made without being limited to the above-described embodiments. Further, different elements in the different embodiments may be combined with each other to form another embodiment.

For example, the plasma processing apparatus used in the method MT may be a plasma processing apparatus other than the capacitively coupled plasma processing apparatus. The plasma processing apparatus is, for example, an inductively coupled plasma processing apparatus, an electron cyclotron resonance (ECR) plasma processing apparatus, or a plasma processing apparatus that generates plasma using a surface wave such as a microwave.

According to an embodiment, it is possible to provide a technique of improving an etching selectivity of a silicon oxide film with respect to etching stop layers when a recess is formed in a silicon oxide film through an etching.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. An etching method comprising:
(a) providing a substrate having a silicon oxide film on a substrate support in a chamber, the substrate including a plurality of etching stop layers arranged inside the silicon oxide film, and the plurality of etching stop layers being arranged at different positions in a thick- ness direction of the silicon oxide film and each formed of at least one of tungsten and molybdenum;

(b) supplying a processing gas into the chamber, the processing gas including a gas containing at least one of tungsten and molybdenum, a gas containing carbon and fluoride, and an oxygen-containing gas; and (c) generating plasma from the processing gas to etch the silicon oxide film, thereby forming a plurality of recesses that reach the plurality of etching stop layers, respectively, in the silicon oxide film.

2. The etching method according to claim 1, wherein the gas containing at least one of tungsten and molybdenum includes at least one of tungsten hexafluoride gas and molybdenum hexafluoride gas.

3. The etching method according to claim 1, wherein in (c), a pressure in the chamber is set to 2.0 Pa or more and 3.3 Pa or less.

4. The etching method according to claim 1, wherein a ratio of a flow rate of the gas containing at least one of tungsten and molybdenum in the processing gas to a flow rate of the processing gas is 5% by volume or less.

5. The etching method according to claim 1, wherein in (c), a temperature of the substrate support is set to 0° C. or higher and 120° C. or lower.

6. The etching method according to claim 1, wherein the processing gas includes fluorocarbon gas as the gas containing carbon and fluoride.

7. The etching method according to claim 6, wherein the fluorocarbon gas includes at least one selected from the group consisting of $C_4F_6$ gas, $C_4F_8$ gas, $C_3F_8$ gas, and $CF_4$ gas.

8. The etching method according to claim 6, wherein the processing gas further includes the oxygen-containing gas.

9. The etching method according to claim 8, wherein the oxygen-containing gas includes at least one selected from the group consisting of $O_2$ gas, CO gas, and $CO_2$ gas.

10. The etching method according to claim 1, wherein the gas containing at least one of tungsten and molybdenum contains a metal same as a metal included in the etching stop layers.

11. The etching method according to claim 1, wherein each of the plurality of recesses has an opening dimension that becomes larger as a depth from a surface of the silicon oxide film to each of the etching stop layers increases.

12. The etching method according to claim 11, wherein the plurality of recesses have substantially a same aspect ratio determined by a ratio of the depth from the surface of the silicon oxide film to each of the etching stop layers with respect to the opening dimension of each of the recesses.

13. The etching method according to claim 1, wherein the substrate includes a mask having a pattern and formed of an organic material, on the silicon oxide film.

14. The etching method according to claim 1, wherein (c) includes periodically applying a pulse voltage to the substrate support.

15. The etching method according to claim 14, wherein in (c), the pulse voltage periodically applied to the substrate support is a negative pulse voltage.

16. The etching method according to claim 14, wherein in (c), an absolute value of the pulse voltage periodically applied to the substrate support is 150 V or more and 1,000 V or less.

17. The etching method according to claim 14, wherein in (c), the pulse voltage periodically applied to the substrate support has a duty ratio of 50% or more and 100% or less.

18. The etching method according to claim 14, wherein in (c), a frequency that defines a cycle in which the pulse voltage is applied to the substrate support is 100 kHz or more and 1 MHz or less.

19. The etching method according to claim 1, wherein the gas containing at least one of tungsten and molybdenum includes the molybdenum.

* * * * *